United States Patent [19]

Kouchich et al.

[11] 4,250,482

[45] Feb. 10, 1981

[54] PACKAGED ELECTRONIC COMPONENT AND METHOD OF PREPARING THE SAME

[75] Inventors: Allan V. Kouchich, Milwaukee; Lawrence D. Radosevich, Muskego; John C. Blanchard, Milwaukee; Neal F. Thomas, Whitefish Bay, all of Wis.

[73] Assignee: Allen-Bradley Company, Milwaukee, Wis.

[21] Appl. No.: 537

[22] Filed: Jan. 2, 1979

[51] Int. Cl.³ .................................... H01C 1/034
[52] U.S. Cl. .................................. 338/275; 338/221; 338/324; 361/417
[58] Field of Search ............... 338/275, 221, 276, 226, 338/322, 329, 324; 339/17 CF, 17 C; 357/68, 70, 72; 361/417, 418, 421; 29/610, 613, 627, 619

[56] References Cited

U.S. PATENT DOCUMENTS

| | | | |
|---|---|---|---|
| 2,587,674 | 3/1952 | Aiken | 338/322 X |
| 2,860,222 | 11/1958 | Saltzman et al. | 338/262 |
| 3,405,381 | 10/1968 | Zandman et al. | 338/275 X |
| 3,781,596 | 12/1973 | Galli et al. | 361/421 X |
| 3,808,506 | 4/1974 | Lang | 339/17 CF X |
| 3,902,148 | 8/1975 | Drees et al. | 357/72 X |
| 4,065,625 | 12/1977 | Iwai et al. | 357/70 X |
| 4,138,691 | 2/1979 | Bonkohara et al. | 357/70 |
| 4,152,689 | 5/1979 | Thompson | 338/226 X |

Primary Examiner—C. L. Albritton
Attorney, Agent, or Firm—Quarles & Brady

[57] ABSTRACT

A packaged electronic component includes an insulating body completely enclosing the electronic component except for runner-like blade leads which extend outwardly from the insulating body. The runner-like blade leads are more durable than conventional shaped leads and facilitate the making and breaking of sliding electrical contact with stationary contacts. A method of preparing the novel, packaged electronic component is also disclosed.

6 Claims, 6 Drawing Figures

PACKAGED ELECTRONIC COMPONENT AND METHOD OF PREPARING THE SAME

The field of the invention is electronic components, and, more particularly, packaged electronic components and a method of preparing the same.

BACKGROUND OF THE INVENTION

The successful development of reliable electronic components and circuits and the desire for increased security has created an interest in the development of identification systems which employ user carried devices such as cards and the like to gain access to otherwise secure information, equipment and/or locations.

In one proposed identification system, the user carried device includes a miniature fixed value resistor and sensor means for determining if the resistor has the proper value. The miniature resistor in the user carried device has leads which make sliding electrical contact with stationary contacts of the identification system when the carrier device is inserted into an appropriate opening. Access is permitted if the resistor has the correct value and denied if it has the wrong value. For such application and other applications, there is a need for small packaged electronic components such as fixed value resistors, which have durable leads which can operate for thousands of cycles and which are an integral part of the packaged component.

There is also a need in other applications for very small fixed value resistors especially those with a length/width aspect ratio of 1 or less. The standard physical sizes of resistors which have been established are primarily based on or determined by the maximum power rating of the given device and the basic technology used in its manufacture. As a result, most of the commonly available resistors are based on a cylindrical geometry with axial leads in which the length/width aspect ratio is greater than 1. This symmetrical geometry is used because of the symmetry considerations and to maximize the electrical length of the resist filament.

In the past, it has been difficult to commercially manufacture very small packaged resistors or resistors having small length width aspect ratio using known resistor preparation technology such as carbon composition, carbon film, metal film or metal glaze in the symmetrical geometry. The commonly used resistor preparation technologies can easily be adapted to make resistors larger than those which are normally encountered. However, problems are encountered when one tries to make very small resistors with a length/width aspect ratio which is less than 1 or with unusual lead or terminal configurations.

SUMMARY OF THE INVENTION

The present invention relates to small, novel, packaged electronic components, such as fixed value resistors, which are especially adapted for use in electronic systems in which the leads of the electronic component must be durable so as to repeatedly make effective sliding electrical contact with stationary contacts of the system. The invention also relates to a method of preparing small packaged electronic components, including fixed value resistors, which have a length width aspect ratio of 1 or less.

The novel packaged electronic component of the present invention includes an insulating body completely enclosing an electronic component or chip except for runner-like blade leads which extend outwardly from the insulating body. The runner-like blade leads are more durable than conventional leads and are shaped to facilitate the making and breaking of sliding electrical contact with stationary contacts.

In a preferred embodiment the insulating body is formed of a deformable plastic so that the electronic component can be staked into an opening in a carrier device.

The inventive method of the present invention includes providing a conducting support member of flat sheet metal and removing portions of the sheet metal of said member to form an opening and a pair of integral spaced apart fingers which extend into the opening. The fingers are connected at one end to the conducting member, and their free ends or tips have integrally formed termination pads. The method further includes attaching and electrically connecting an electronic chip to said termination pads, forming a package of insulating material enclosing the fingers, termination pads and electronic chip, curing the insulating material, if necessary, and then trimming the sheet metal of the conductive support member to form the leads and free the packaged electronic component from the support member.

The method of the present invention is unique in that in the normal method of preparing a packaged electronic component, the conventional long, narrow leads are first formed on a lead frame carrier. The leads are then connected to the component, the packaging completed and the leads cut free from the carrier. In contrast, in the method of the present invention, the runner-like leads are formed after the packaging of the component is complete by trimming away the conductive sheet metal support member from which the inwardly directed fingers and termination pads were formed.

It is an object of the present invention to provide a packaged, miniaturized electronic component which has broad outwardly extending runner-like blade leads which are especially adapted for repeatedly making sliding electrical contact with stationary contacts.

It is another object of the invention to provide a method of preparing a novel, packaged electronic component with unconventional shaped leads.

It is further object of the invention to provide and disclose a method of preparing an electronic component such as a fixed value resistor which has a length/width aspect ratio of 1 or less.

The foregoing and other objects and advantages of the invention will appear from the following description. In the description, reference is made to the accompanying drawings which form a part hereof, and in which there is shown by way of illustration and not of limitation preferred embodiments of the invention. Such embodiments do not represent the full scope of the invention, but rather the invention may be employed in a variety of forms, and reference is made to the claims herein for determining the breadth of the invention.

DESCRIPTION OF THE PREFERRED EMBODIMENT

Figure 1:
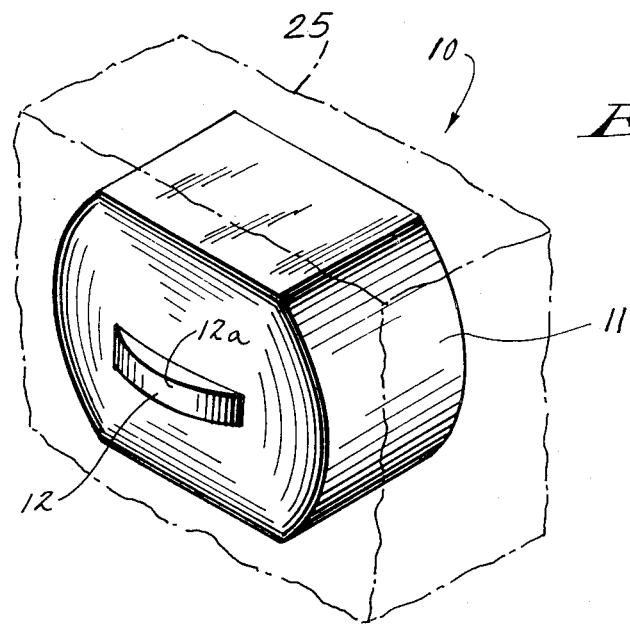
FIG. 1 is an enlarged perspective view of a preferred embodiment of the packaged electronic component of the present invention.
Figure 2:
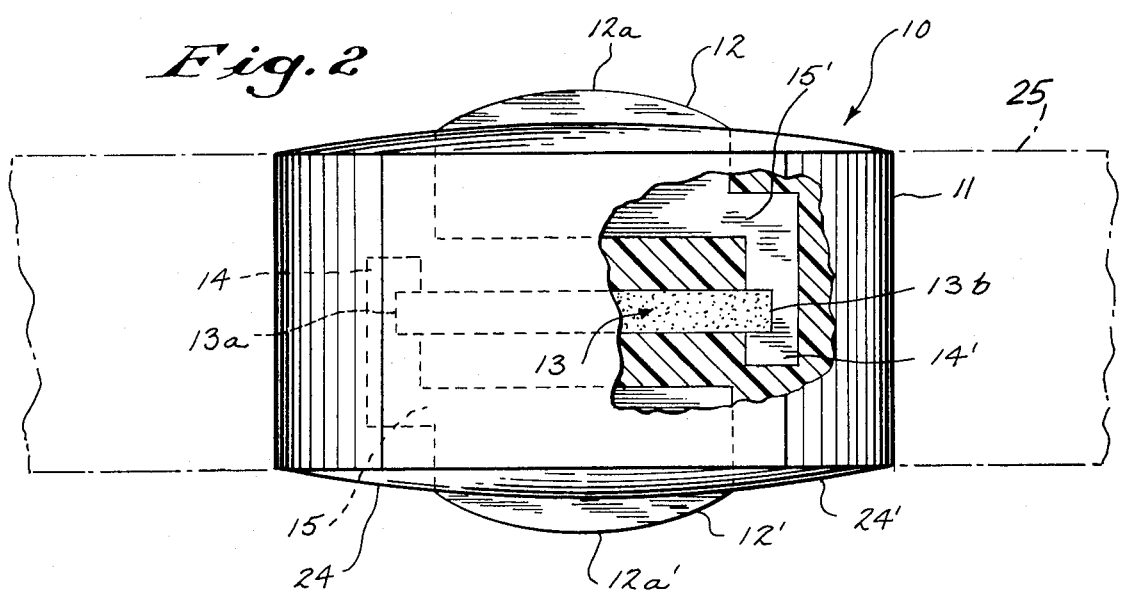
FIG. 2 is a top view, partly in section, of the packaged electronic component of FIG. 1.

In FIGS. 1 and 2 of the drawings, the packaged electronic component 10 can be seen to include an insulating body 11 having a pair of runner-like leads 12,12'. As seen in FIG. 2, an electronic chip 13 is electrically connected by its terminals 13a and 13b to termination pads 14,14'. Each termination pad 14,14' is connected to its own finger 15,15' which is in turn connected to a separate runner-like lead 12,12'. The runner-like leads 12,12' are preferably tapered from their apex 12a,12a' toward each end to facilitate the easy making and breaking of sliding electrical contact with stationary contacts of an electrical system (not shown).

Figure 3A:
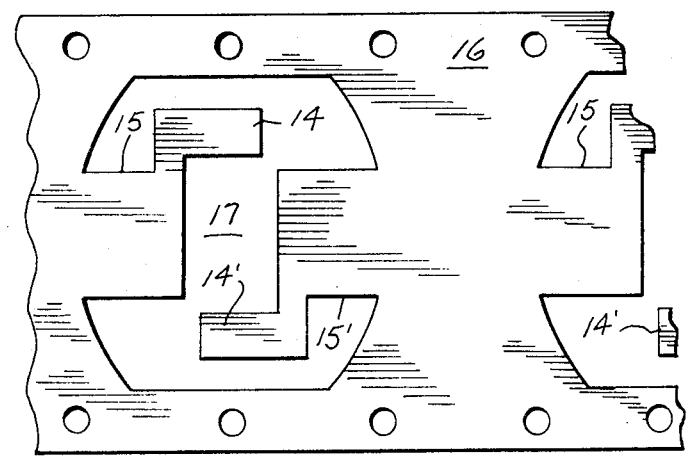
FIGS. 3a–3d constitute a schematic portrayal of the steps of a preferred method of manufacturing the packaged electronic component of FIG. 1.

The preferred method of preparing the packaged electronic component of FIGS. 1 and 2 will now be described in connection with FIGS. 3a to 3d. In FIG. 3a is seen an electrically conductive sheet metal support member 16, which has been die cut to remove a portion of the sheet metal and to form an opening 17, the fingers 15,15' which extend into the opening 17 and the termination pads 14,14'.

Figure 3B:
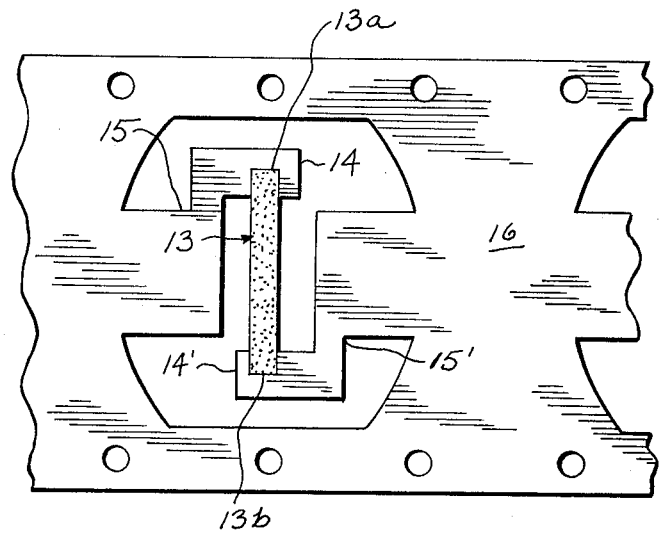
Figure 3C:
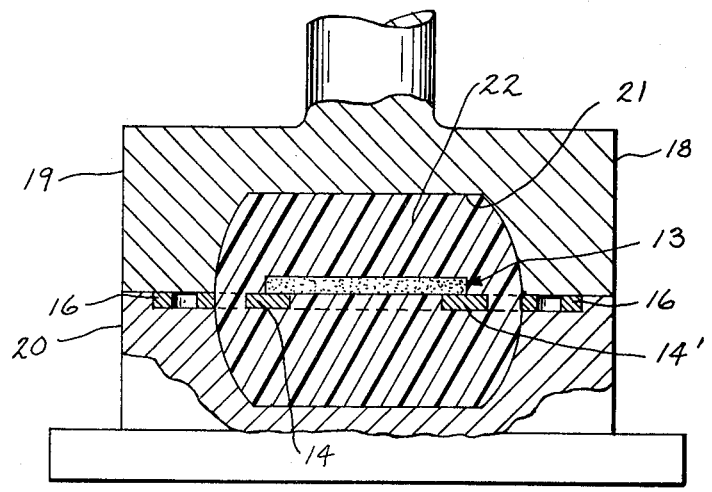

In the next step of the method, each of the terminals 13a,13b of chip 13 is then attached and electrically connected to a respective termination pad 14,14' by any standard bonding procedure such as soldering, welding or the use of conductive plastic adhesive of the like. The thus positioned chip 13 is shown in FIG. 3b.

When the electronic chip 13 has been properly attached to the termination pads 14,14' a split mold 18 having an upper piece 19 and a lower piece 20 is positioned upon the support member 16. As seen in cross section in FIG. 3c, a cavity 21 formed by the mold piece 19 and 20 and the support plate 16 is filled with insulating material 22 to completely enclose the electronic chip 13, the termination pads 14,14' and the fingers 15,15'.

Figure 3D:
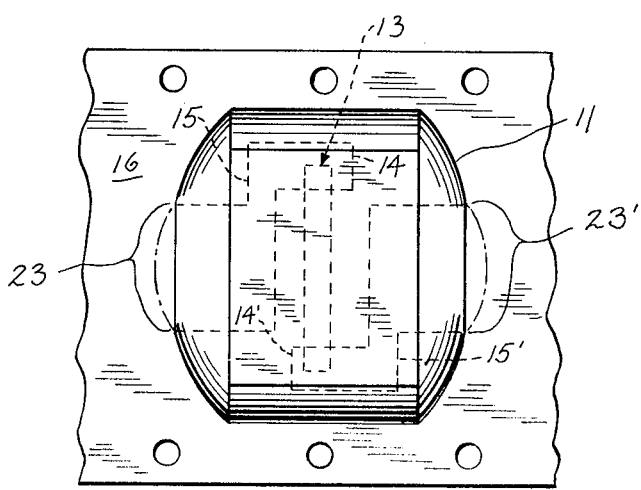

Once the insulating material has cured, the mold 18 is split and removed leaving behind the insulating body 11 on the support member 16 as seen in FIG. 3d. The runner-like leads 12,12' are then formed by trimming the support member 16 along the dotted lines 23,23' shown in FIG. 3d to produce the packaged electronic component 10 seen in FIGS. 1 and 2.

As can be seen in the drawings, the runner-like leads 12,12' are relatively broad and particularly configured for repeatedly making sliding contact with stationary contacts. In the preferred embodiment shown in the drawings, the runner-like leads 12,12' taper from the apex 12a,12a' in both directions to further facilitate the making and breaking of sliding electronic contact with the stationary contacts.

Returning now to FIGS. 1 and 2, it can be seen that when the packaged electronic component 10 of the present invention is staked or otherwise secured within a carrier device 25 (shown in phantom lines) the runner-like leads 12,12' which are located near the center of the insulating body 11 do not extend to the mating surfaces of the insulating body 11 and the carrier device. As seen only in FIG. 2, the conductive runner-like leads 12,12' are spaced from edges of insulating body 11 by the gently curved portions 24,24' of the side walls of the insulating body 11 thereby permitting the carrier device 25 to be made of metal or other conductive material. The curved portions 24,24' of the side walls of the insulating body also serve as lead-ins further facilitating the making and breaking of the sliding contact with stationary contacts. Obviously, if the carrier device 25 is made of an insulating material the leads 12,12' can extend the full length of the sidewall, if desired.

The preferred insulating material is a deformable thermoplastic resin which flows easily at normal temperatures to fill the cavity 21 and which when hardened is deformable so that the packaged electronic component can be staked into an opening in a carrier device 25. Insulating materials having other desirable properties can also be employed, if desired.

It will be apparent from the foregoing description that a novel and useful method has been disclosed for preparing packaged electronic components having runner-like leads. It will also be apparent to those skilled in the art that the method described in connection with the drawings FIGS. 3a to 3d makes it possible to make small packaged resistors having a length-width aspect ratio of 1 or less as the length and width dimensions of the insulating body 11 can be varied to provide any desired aspect. As previously indicated, it has not been considered practical to make resistors having such small lenght/width aspect ratios by conventional methods.

Although in the foregoing description the packaging of fixed value resistors has been discussed, it will be readily understood to those skilled in the art that other types of electronic components such as semi-conductors, etc., can be packaged in a similar manner. It will be further apparent to those skilled in the art that the method described makes it readily possible to prepare packaged electronic components with unusual shaped leads and that, therefore, the use of the method is not limited to making packages with runner-type leads.

Those skilled in the art will recognize that variations can be made in the preferred embodiments of the invention without departing from the spirit thereof. For example, although a preferred embodiment has been shown in which the electronic component includes a single chip with a single pair of external leads it is to be understood that electronic components containing more than one chip and/or more than one pair of leads are intended to be within the scope of the invention. Furthermore, the terms used to describe the invention in the specification and claims should not be too narrowly interpreted. For example, the term "fingers" is intended to cover any shaped member which extends into the window or opening 17 and provides termination pads for connection to the electronic chip. Accordingly, the invention is not to be limited by the specific illustrated embodiments, but only by the scope of the appended claims.

We claim:

1. A packaged electronic component includes an insulating body, an electronic chip disposed within the insulating body and having a pair of terminals, and two members of conductive sheet material which connect to opposite terminals, the two members extending laterally from said terminals to the outside of the insulating body and forming a pair of runner-like leads that terminate said laterally extending members.

2. The packaged electronic component of claim 1, in which the runner-like leads are elongated and extend a greater distance along said insulating body than outwardly from it.

3. The packaged electronic component of claim 1, in which the runner-like leads each have an elongated, outwardly facing surface that is curved along its length, each outwardly facing surface having a breadth that is the thickness of the member on which it is formed.

4. The packaged electronic component of claim 1, in which the insulating body has a length width ratio of less than 1.

5. The packaged electronic component of claim 1, in which the insulating body is formed with edges and with tapered areas leading from the edges of the insulating body to the runner-like leads to facilitate the slidable movement of the leads into contact with a pair of stationary contacts.

6. A packaged electronic component that is made of only four elements, the component including:
   an insulating body;
   an electronic chip disposed within the insulating body and having a pair of terminals; and
   a pair of electrically conductive sheet-like members, each member having a first section that extends inwardly into the insulating body and is electrically connected to a respective terminal of the electronic chip, and each member having a second section that extends outside the insulating body and provides a runner-like lead that facilitates the making and breaking of sliding electrical contact with a respective one of a pair of stationary contacts.

* * * * *

UNITED STATES PATENT AND TRADEMARK OFFICE
CERTIFICATE OF CORRECTION

PATENT NO. : 4,250,482

DATED : February 10, 1981

INVENTOR(S) : Allan V. Kouchich, Lawrence D. Radosevich, John C. Blanchard, Neal F. Thomas It is certified that error appears in the above—identified patent and that said Letters Patent is hereby corrected as shown below:

Column 1, line 44 change "length width" to --length/width--

Column 1, line 64 change "length width" to -- length/width--

Column 2, line 45 after "It is" insert --a--

Column 3, line 52 change "electronic" to --electrical--

Column 5, line 2 change "length width" to --length/width--

Signed and Sealed this

Second Day of June 1981

[SEAL]

Attest:

RENE D. TEGTMEYER

Attesting Officer

Acting Commissioner of Patents and Trademarks